United States Patent
Gao et al.

(10) Patent No.: US 12,538,747 B2
(45) Date of Patent: Jan. 27, 2026

(54) FRONTSIDE AND BACKSIDE PRESSURE MONITORING FOR SUBSTRATE MOVEMENT PREVENTION

(71) Applicant: LAM RESEARCH CORPORATION, Fremont, CA (US)

(72) Inventors: Songqi Gao, Sunnyvale, CA (US); Goon Heng Wong, Tualatin, OR (US); Jack Chen, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 607 days.

(21) Appl. No.: 18/013,091

(22) PCT Filed: Jun. 7, 2022

(86) PCT No.: PCT/US2022/032456
§ 371 (c)(1),
(2) Date: Dec. 27, 2022

(87) PCT Pub. No.: WO2022/265882
PCT Pub. Date: Dec. 22, 2022

(65) Prior Publication Data
US 2023/0141653 A1 May 11, 2023

Related U.S. Application Data

(60) Provisional application No. 63/210,444, filed on Jun. 14, 2021.

(51) Int. Cl.
*H01L 21/683* (2006.01)
*H01J 37/32* (2006.01)

(52) U.S. Cl.
CPC .... *H01L 21/6831* (2013.01); *H01J 37/32816* (2013.01); *H01J 37/32834* (2013.01); *H01J 37/3299* (2013.01)

(58) Field of Classification Search
CPC .............. H01L 21/6831; H01L 21/6833; H01J 37/32834; H01J 37/32816; H01J 37/3299; Y10T 137/0396
See application file for complete search history.

(56) References Cited

U.S. PATENT DOCUMENTS 5,571,366 A * 11/1996 Ishii ..................... H01J 37/3299
216/60
5,758,680 A * 6/1998 Kaveh ................ G05D 16/2013
438/909

(Continued)

FOREIGN PATENT DOCUMENTS

JP  2017183700 A  10/2017
KR  101563635 B1 * 10/2015 ............. H01L 22/12

OTHER PUBLICATIONS

International Search Report and Written Opinion of the ISA issued in PCT/US2022/032456, mailed Oct. 4, 2022; ISA/KR.

*Primary Examiner* — David Colon-Morales

(57) ABSTRACT

A pressure control system includes a first sensor, a second sensor, an evacuation valve and a controller. The first sensor is configured to detect a frontside pressure within a processing chamber. The frontside pressure is indicative of a downforce on a substrate disposed on a substrate support within the processing chamber. The second sensor is configured to detect a backside pressure on a backside of the substrate. The controller is configured to: control the evacuation valve to remove gas from and reduce the frontside pressure of the processing chamber; and during the removal of gas from a reduction in the frontside pressure of the processing chamber and based on the frontside pressure and the backside pressure, regulate an opening of the evacuation valve such that the frontside pressure does not drop below the backside pressure.

34 Claims, 10 Drawing Sheets

(56) References Cited

U.S. PATENT DOCUMENTS

| | | | | |
|---|---|---|---|---|
| 5,803,107 | A * | 9/1998 | Kaveh | G05D 16/202 |
| | | | | 438/909 |
| 6,142,163 | A * | 11/2000 | McMillin | G05D 16/2013 |
| | | | | 137/487.5 |
| 9,831,112 | B2 * | 11/2017 | Koiwa | H01L 21/67109 |
| 11,527,421 | B2 * | 12/2022 | Liang | H01L 21/67745 |
| 11,538,704 | B2 * | 12/2022 | Watanabe | H01L 21/6838 |
| 11,742,188 | B2 * | 8/2023 | Miura | H01J 37/3244 |
| | | | | 156/345.26 |
| 11,894,220 | B2 * | 2/2024 | Nichols | H01J 37/32449 |
| 12,315,704 | B2 * | 5/2025 | Saitoh | H01L 21/6831 |
| 2002/0001928 | A1 * | 1/2002 | Wang | H01L 21/76862 |
| | | | | 257/E21.162 |
| 2005/0189074 | A1 * | 9/2005 | Kasai | H01L 21/6831 |
| | | | | 156/345.33 |
| 2016/0230269 | A1 * | 8/2016 | Raj | C23C 14/042 |
| 2017/0278730 | A1 * | 9/2017 | Tandou | H01J 37/32715 |
| 2019/0287770 | A1 * | 9/2019 | Iwase | H01J 37/32834 |
| 2020/0020564 | A1 * | 1/2020 | Liu | H01L 22/10 |
| 2020/0411359 | A1 * | 12/2020 | AuBuchon | H01L 21/67126 |
| 2023/0212753 | A1 * | 7/2023 | Inada | C23C 16/507 |

\* cited by examiner

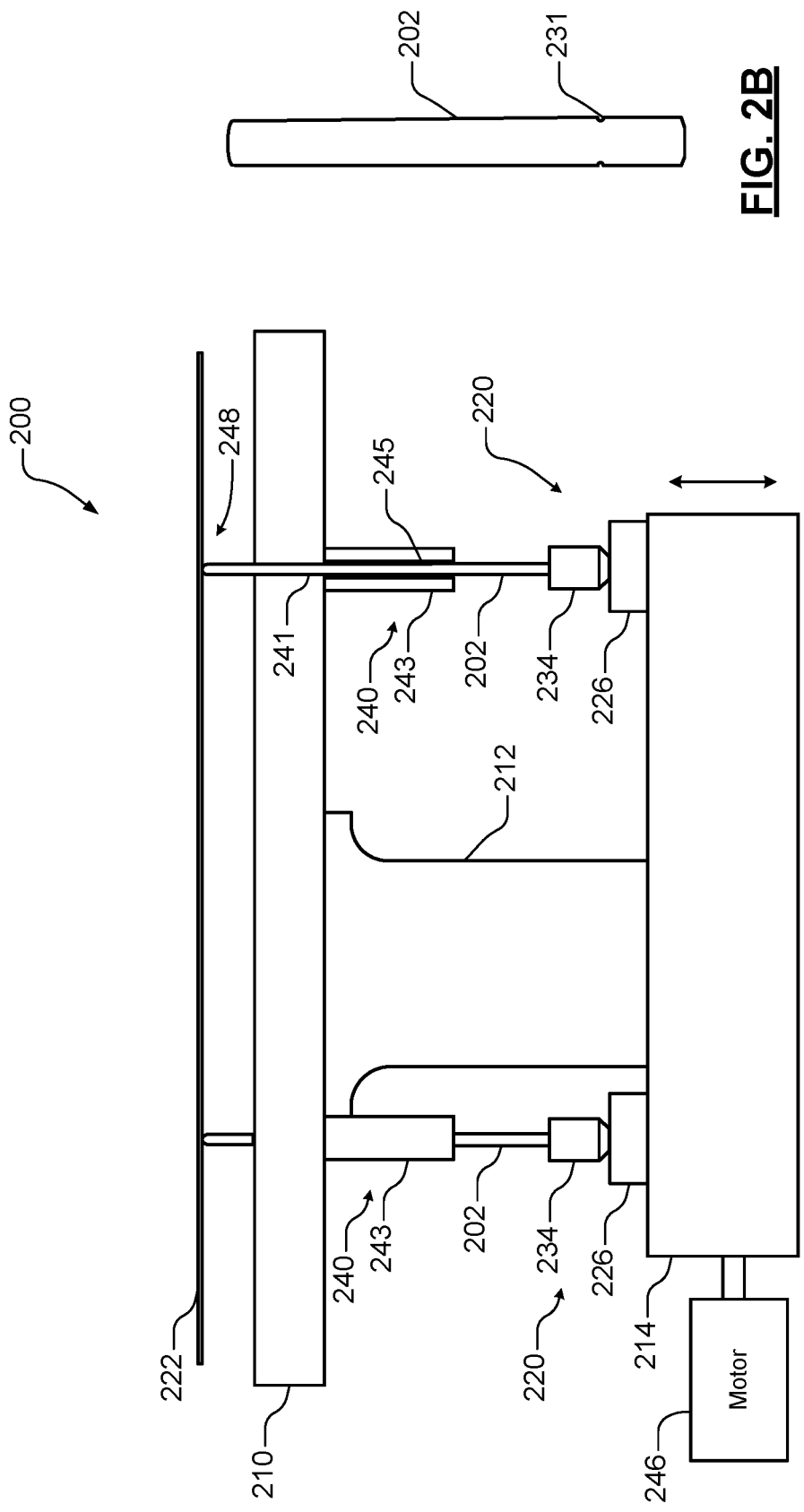

FRONTSIDE AND BACKSIDE PRESSURE MONITORING FOR SUBSTRATE MOVEMENT PREVENTION

CROSS-REFERENCE TO RELATED APPLICATIONS

This application is a U.S. National Phase Application under 35 U.S.C. 371 of International Application No. PCT/US2022/032456, filed Jun. 7, 2022, which claims the benefit of U.S. Provisional Application No. 63/210,444, filed on Jun. 14, 2021. The entire disclosures of the applications referenced above are incorporated herein by reference.

FIELD

The present disclosure relates to generally to substrate processing systems and more particularly to pressure control systems for preventing substrate movement.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit, etch, ash, clean or otherwise perform treatment of film on a substrate such as a semiconductor wafer. The substrate processing systems typically include a processing chamber, a gas distribution device, and a substrate support assembly. During processing, the substrate is arranged on the substrate support assembly. Different gas mixtures may be introduced into the processing chamber. Radio frequency (RF) plasma and/or heat may be used to activate chemical reactions.

Prior to processing, the substrate is transferred into the processing chamber and disposed on lift pins of a substrate support. The lift pins are then lowered to place the substrate on a body of the substrate support. The processing chamber is pressurized according to a process recipe. Subsequent to processing, the substrate is lifted from the substrate support via the lift pins and then the processing chamber is depressurized. The substrate is removed from the processing chamber after depressurization.

SUMMARY

A pressure control system is provided and includes a first sensor, a second sensor, an evacuation valve and a controller. The first sensor is configured to detect a frontside pressure within a processing chamber. The frontside pressure is indicative of a downforce on a substrate disposed on a substrate support within the processing chamber. The second sensor is configured to detect a backside pressure on a backside of the substrate. The controller is configured to: control the evacuation valve to remove gas from and reduce the frontside pressure of the processing chamber; and during the removal of gas from and reduction in the frontside pressure of the processing chamber and based on the frontside pressure and the backside pressure, regulate an opening of the evacuation valve such that the frontside pressure does not drop below the backside pressure.

In other features, the controller is configured to: during the removal of gas from and reduction in frontside pressure of the processing chamber, compare the frontside pressure to the backside pressure to provide a pressure differential value; transition the evacuation valve from a first open state to a second open state when at least one of a rate of change of the pressure differential value exceeds a first threshold or the pressure differential value is less than or equal to a second threshold, wherein the second open state is a more closed state than the first open state; and transition the evacuation valve from the first open state to a third open state, when at least one of the rate of change of the pressure differential value does not exceed the first threshold or the pressure differential value is greater than the second threshold, wherein the third open state is a more open state than the first open state.

In other features, the controller is configured to close the evacuation valve when the frontside pressure is less than or equal to the backside pressure. In other features, the controller is configured to remove gas from the processing chamber and regulate the opening of the evacuation valve at least one of during or subsequent to processing the substrate.

In other features, the pressure control system further includes a backside valve. The controller is configured to open the backside valve to continuously draw gas from the backside of the substrate during processing and removal of gas from the processing chamber. In other features, the controller is configured to regulate the evacuation valve to maintain at least a safety margin between the frontside pressure and the backside pressure.

In other features, the controller is configured to, during the removal of gas from and reduction in the frontside pressure of the processing chamber, maximize an opening of the evacuation valve to maximize a depressurization rate of the processing chamber while at least one of preventing the frontside pressure from dropping below the backside pressure or maintaining at least a safety margin between the frontside pressure and the backside pressure.

In other features, the controller is configured to: during the removal of gas from and reduction in the frontside pressure of the processing chamber, determine whether the frontside pressure is less than a predetermined pressure; and when the frontside pressure is less than the predetermined pressure, actuate lift pins to lift the substrate off a top surface of a body of the substrate support. In other features, the predetermined pressure is 4-5 Torr.

In other features, the controller is configured to: pressurize the processing chamber to provide a first frontside pressure; process the substrate according to a first portion of a recipe; remove gas from the processing chamber to provide a second frontside pressure that is less than the first frontside pressure; and process the substrate according to a second portion of the recipe. In other features, the first frontside pressure is greater than 4-5 Torr.

In other features, the substrate support is void of mechanical and electrical components to hold the substrate in place on the substrate support. The controller is configured to prevent the substrate from moving on the substrate support by pressuring the processing chamber.

In other features, the substrate support is implemented as an electrostatic chuck. The controller is configured to, during the removal of gas from and reduction in the frontside pressure of the processing chamber, cease electrostatic clamping of the substrate prior to lifting the substrate off a top surface of a body of the substrate support.

In other features, the controller is configured to remove gas from the processing chamber to at least partially depressurize the processing chamber prior to actuating lift pins of the substrate support to lift the substrate off a top surface of a body of the substrate support. In other features, the controller is configured to remove gas from the processing chamber to reduce the frontside pressure in the processing chamber to less than a predetermined pressure prior to actuating lift pins of the substrate support to lift the substrate off a top surface of a body of the substrate support. In other features, the pressure control system further includes a pump. The controller is configured to run the pump to draw gas from the processing chamber to depressurize the processing chamber.

In other features, the pressure control system further includes: an evacuation line extending from the processing chamber to the pump; a backside line extending from a channel in a body of the substrate support to the evacuation line; and a backside valve connected to the backside line and configured to control flow of gas through the backside line. The evacuation valve is attached to the evacuation line upstream from the backside line. In other features, the backside sensor detects pressure within the backside line.

In other features, a method of operating a pressure control system is provided. The method includes: detecting a frontside pressure within a processing chamber, wherein the frontside pressure is indicative of a downforce on a substrate disposed on a substrate support within the processing chamber; detecting a backside pressure on a backside of the substrate; controlling an evacuation valve to remove gas from and reduce the frontside pressure of the processing chamber; and during the removal of gas from and reduction in frontside pressure of the processing chamber and based on the frontside pressure and the backside pressure, regulate an opening of the evacuation valve such that the frontside pressure does not drop below the backside pressure.

In other features, the method further includes: during the removal of gas from and reduction in frontside pressure of the processing chamber, comparing the frontside pressure to the backside pressure to provide a pressure differential value; transitioning the evacuation valve from a first open state to a second open state when at least one of a rate of change of the pressure differential value exceeds a first threshold or the pressure differential value is less than or equal to a second threshold, where the second open state is a more closed state than the first open state; and transitioning the evacuation valve from the first open state to a third open state, when at least one of the rate of change of the pressure differential value does not exceed the first threshold or the pressure differential value is greater than the second threshold. The third open state is a more open state than the first open state.

In other features, the method further includes closing the evacuation valve when the frontside pressure is less than or equal to the backside pressure. In other features, the method further includes removing gas from the processing chamber and regulating the opening of the evacuation valve at least one of during or subsequent to processing the substrate.

In other features, the method further includes opening a backside valve to continuously draw gas from the backside of the substrate during processing and removal of gas from the processing chamber. In other features, the method further includes regulating the evacuation valve to maintain at least a safety margin between the frontside pressure and the backside pressure.

In other features, the method further includes, during the removal of gas from and reduction in the frontside pressure of the processing chamber, maximizing an opening of the evacuation valve to maximize a depressurization rate of the processing chamber while at least one of preventing the frontside pressure from dropping below the backside pressure or maintaining at least a safety margin between the frontside pressure and the backside pressure.

In other features, the method further includes: during the removal of gas from and reduction in the frontside pressure of the processing chamber, determining whether the frontside pressure is less than a predetermined pressure; and when the frontside pressure is less than the predetermined pressure, actuating lift pins to lift the substrate off a top surface of a body of the substrate support. In other features, the predetermined pressure is 4-5 Torr.

In other features, the method further includes: pressurizing the processing chamber to provide a first frontside pressure; processing the substrate according to a first portion of a recipe; removing gas from the processing chamber to depressurize the processing chamber and provide a second frontside pressure that is less than the first frontside pressure; and processing the substrate according to a second portion of the recipe. In other features, the first frontside pressure is greater than 4-5 Torr.

In other features, the method further includes preventing the substrate from moving on the substrate support by pressuring the processing chamber. The substrate support is void of mechanical and electrical components to hold the substrate in place on the substrate support.

In other features, the method further includes, during the removal of gas from and reduction in the frontside pressure of the processing chamber, ceasing electrostatic clamping of the substrate prior to lifting the substrate off a top surface of a body of the substrate support. In other features, the method further includes removing gas from the processing chamber to at least partially depressurize the processing chamber prior to actuating lift pins of the substrate support to lift the substrate off a top surface of a body of the substrate support.

In other features, the method further includes removing gas from the processing chamber to reduce the frontside pressure in the processing chamber to less than a predetermined pressure prior to actuating lift pins of the substrate support to lift the substrate off a top surface of a body of the substrate support. In other features, the method further includes running a pump to draw gas from the processing chamber to depressurize the processing chamber.

In other features, a pressure control system is provided and includes a first sensor, a second sensor, an evacuation valve and a controller. The first sensor is configured to detect a frontside pressure within a processing chamber. The frontside pressure is indicative of a downforce on a substrate disposed on a substrate support within the processing chamber. The second sensor is configured to detect a backside pressure on a backside of the substrate. The controller is configured to: control the evacuation valve to depressurize the processing chamber; and during the depressurization of the processing chamber and based on the frontside pressure and the backside pressure, regulate a position of the evacuation valve such that the frontside pressure does not drop below the backside pressure.

In other features, the controller is configured to: during the depressurization of the processing chamber, compare the frontside pressure to the backside pressure to provide a pressure differential value; transition the evacuation valve from a first position to a second position when at least one of a rate of change of the pressure differential value exceeds a first threshold or the pressure differential value is less than or equal to a second threshold, where the second position is a more closed position than the first position; and transition the evacuation valve from the first position to a third position, when at least one of the rate of change of the pressure differential value does not exceed the first threshold or the pressure differential value is greater than the second threshold, where the third position is a more open position than the first position.

In other features, the controller is configured to close the evacuation valve when the frontside pressure is less than or equal to the backside pressure. In other features, the controller is configured to depressurize the processing chamber and regulate the position of the evacuation valve at least one of during or subsequent to processing the substrate.

In other features, the pressure control system of further includes a backside valve. The controller is configured to open the backside valve to continuously draw gas from the backside of the substrate during processing and depressurization of the processing chamber. In other features, the controller is configured to regulate the evacuation valve to maintain at least a safety margin between the frontside pressure and the backside pressure.

In other features, the controller is configured to, during the depressurization of the processing chamber, maximize an opening of the evacuation valve to maximize a depressurization rate of the processing chamber while at least one of preventing the frontside pressure from dropping below the backside pressure or maintaining at least a safety margin between the frontside pressure and the backside pressure.

In other features, the controller is configured to: during the depressurization of the processing chamber, determine whether the frontside pressure is less than a predetermined pressure; and when the frontside pressure is less than the predetermined pressure, actuate lift pins to lift the substrate off a top surface of a body of the substrate support. In other features, the predetermined pressure is 4-5 Torr.

In other features, the controller is configured to: pressurize the processing chamber to provide a first frontside pressure; process the substrate according to a first portion of a recipe; depressurize the processing chamber to provide a second frontside pressure that is less than the first frontside pressure; and process the substrate according to a second portion of the recipe. In other features, the first frontside pressure is greater than 4-5 Torr.

In other features, the substrate support is void of mechanical and electrical components to hold the substrate in place on the substrate support; and the controller is configured to prevent the substrate from moving on the substrate support by pressuring the processing chamber.

In other features, the substrate support is implemented as an electrostatic chuck. The controller is configured to, during the depressurization of the processing chamber, cease electrostatic clamping of the substrate prior to lifting the substrate off a top surface of a body of the substrate support.

In other features, the controller is configured to at least partially depressurize the processing chamber prior to actuating lift pins of the substrate support to lift the substrate off a top surface of a body of the substrate support. In other features, the controller is configured to depressurize the processing chamber to less than a predetermined pressure prior to actuating lift pins of the substrate support to lift the substrate off a top surface of a body of the substrate support.

In other features, the pressure control system further includes a pump. The controller is configured to run the pump to draw gas from the processing chamber to depressurize the processing chamber.

In other features, the pressure control system further includes: an evacuation line extending from the processing chamber to the pump; a backside line extending from a channel in a body of the substrate support to the evacuation line; and a backside valve connected to the backside line and configured to control flow of gas through the backside line. The evacuation valve is attached to the evacuation line upstream from the backside line. In other features, the backside sensor detects pressure within the backside line.

In other features, a method of operating a pressure control system is provided. The method includes: detecting a frontside pressure within a processing chamber, where the frontside pressure is indicative of a downforce on a substrate disposed on a substrate support within the processing chamber; detecting a backside pressure on a backside of the substrate; controlling an evacuation valve to depressurize the processing chamber; and during the depressurization of the processing chamber and based on the frontside pressure and the backside pressure, regulate a position of the evacuation valve such that the frontside pressure does not drop below the backside pressure.

In other features, the method further includes: during the depressurization of the processing chamber, comparing the frontside pressure to the backside pressure to provide a pressure differential value; transitioning the evacuation valve from a first position to a second position when at least one of a rate of change of the pressure differential value exceeds a first threshold or the pressure differential value is less than or equal to a second threshold, where the second position is a more closed position than the first position; and transitioning the evacuation valve from the first position to a third position, when at least one of the rate of change of the pressure differential value does not exceed the first threshold or the pressure differential value is greater than the second threshold, where the third position is a more open position than the first position.

In other features, the method further includes closing the evacuation valve when the frontside pressure is less than or equal to the backside pressure. In other features, the method further includes depressurizing the processing chamber and regulating the position of the evacuation valve at least one of during or subsequent to processing the substrate.

In other features, the method further includes opening a backside valve to continuously draw gas from the backside of the substrate during processing and depressurization of the processing chamber. In other features, the method further includes regulating the evacuation valve to maintain at least a safety margin between the frontside pressure and the backside pressure.

In other features, the method further includes, during the depressurization of the processing chamber, maximizing an opening of the evacuation valve to maximize a depressurization rate of the processing chamber while at least one of preventing the frontside pressure from dropping below the backside pressure or maintaining at least a safety margin between the frontside pressure and the backside pressure.

In other features, the method further includes: during the depressurization of the processing chamber, determining whether the frontside pressure is less than a predetermined pressure; and when the frontside pressure is less than the predetermined pressure, actuating lift pins to lift the substrate off a top surface of a body of the substrate support. In other features, the predetermined pressure is 4-5 Torr.

In other features, the method further includes: pressurizing the processing chamber to provide a first frontside pressure; processing the substrate according to a first portion of a recipe; depressurizing the processing chamber to provide a second frontside pressure that is less than the first frontside pressure; and processing the substrate according to a second portion of the recipe. In other features, the first frontside pressure is greater than 4-5 Torr.

In other features, the method further includes preventing the substrate from moving on the substrate support by pressuring the processing chamber, where the substrate support is void of mechanical and electrical components to hold the substrate in place on the substrate support.

In other features, the method further includes, during the depressurization of the processing chamber, ceasing electrostatic clamping of the substrate prior to lifting the substrate off a top surface of a body of the substrate support. In other features, the method further includes at least partially depressurizing the processing chamber prior to actuating lift pins of the substrate support to lift the substrate off a top surface of a body of the substrate support.

In other features, the method further includes depressurizing the processing chamber to less than a predetermined pressure prior to actuating lift pins of the substrate support to lift the substrate off a top surface of a body of the substrate support. In other features, the method further includes running a pump to draw gas from the processing chamber to depressurize the processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A-2B shows an example of a substrate support assembly and lift pins used in the substrate processing system of FIG. 1;

In the drawings, reference numbers may be reused to identify similar and/or identical elements.

DETAILED DESCRIPTION

Figure 1:
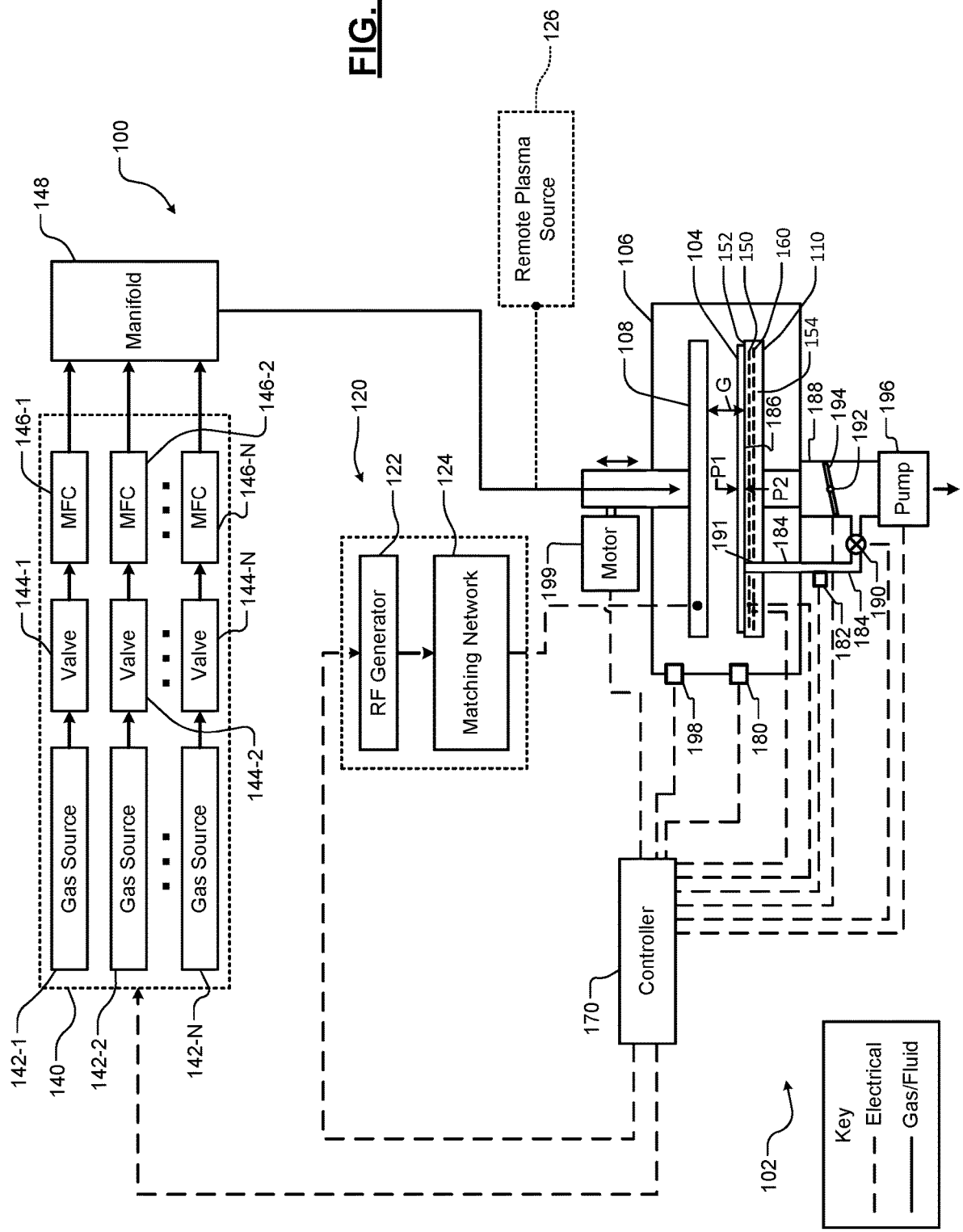
FIG. 1 shows an example substrate processing system including a pressure control system in accordance with the present disclosure.

Prior to processing, a substrate is disposed within a processing chamber and on a substrate support. The substrate support may not be configured with mechanical and/or electrical components to prevent movement of the substrate. For example, the substrate support may not include a mechanical fixture for holding the substrate and/or electrostatic clamping electrodes for clamping the substrate to a body of the substrate support. The substrate may instead be held in place due to a pressure differential created between opposing surfaces of the substrate. When gas is introduced into the processing chamber and pressure in the processing chamber increases, the substrate does not move due to pressure on the top side of the substrate being greater than pressure on the bottom side of the substrate. The pressure of the top side of the substrate is referred to as the frontside pressure and the pressure on the bottom side of the substrate is referred to as the backside pressure. The substrate is processed at a frontside pressure that is higher than a base pressure provided when under vacuum.

The processing chamber may be depressurized during processing and/or subsequent to processing and prior to removal of the substrate from the processing chamber. The terms "depressure", "depressurized", "depressurizing" and "depressurization" as used herein refers to the removal of gas from a processing chamber to reduce a frontside pressure and/or a backside pressure within the processing chamber. As an example, a recipe may call for the frontside pressure to decrease from a high pressure to a low pressure, which requires depressurization of the processing chamber. During depressurization, the frontside pressure may be reduced to a reduced pressure and/or a low pressure above a base pressure or may be reduced to the base pressure. During depressurization, there is a chance that the frontside pressure drops below the backside pressure, such that the backside pressure exceeds the frontside pressure.

The frontside pressure may drop below the backside pressure because a rate at which an area on the frontside of the substrate is depressurized is quicker than a rate at which an area on the backside of the substrate is depressurized. The gas evacuation line through which gas is pumped out of the processing chamber is typically significantly larger in diameter and/or cross-sectional area than a backside line through which gas is drawn from the area on the backside of the substrate. The gas flow rate (or gas conductance rate) through the backside line is significantly lower than the gas flow rate through the gas evacuation line. As a result, the frontside pressure drops quicker and can drop below the backside pressure. The higher the frontside pressure, the more likely this is to occur. At higher frontside pressures, the backside pressure tends to creep higher from a base pressure at vacuum to a pressure, for example, as high as 1-2 Torr. The substrate may move from a predetermined processing position when the backside pressure is greater than the frontside pressure. For this reason, conventional substrate processing, especially when a substrate is only held in place by the stated pressure differential, has been limited to recipes that do not call for depressurization due to the associated risk for substrate movement.

Traditionally and subsequent to processing a substrate within a processing chamber, lift pins of a substrate support are driven upward to overcome a downward pressure on the substrate. This occurs prior to the processing chamber being depressurized. Pressure within the processing chamber is maintained to maintain the downward pressure on the substrate until the substrate is lifted to prevent substrate movement. When the substrate is lifted, the frontside pressure quickly drops such that there is no longer a pressure differential between the frontside and the backside of the substrate. Gas within the chamber moves to an area on the backside, thereby equalizing the pressures on the frontside and the backside.

The higher the frontside pressure during processing, the more force needed subsequent to processing to drive the lift pins upward and overcome the frontside downward pressure on the substrate. The higher the frontside pressure, the greater the chances of the substrate "popping" and/or shifting when lifted. This is because of the quick change in pressure differential, which results in the substrate momentarily hopping off and/or shifting on the lift pins. The high frontside pressure causes a high downforce on the substrate and during a mechanical lift pins up operation the substrate "pops" or slides relative to a top surface of the body of the substrate support. Also, the higher the processing chamber pressure, the more movement of the substrate when lifted. This movement is not consistent and can be in different directions. Because of the potential for substrate movement as a result of processing at high pressures, processing pressures are typically limited to less than a predetermined pressure threshold (e.g., 4-5 Torr). Below the predetermined pressure threshold, the substrate tends not to experience a popping when lifting the substrate and there is typically negligible to no shifting in position. However, as chamber pressure increases above the predetermined pressure threshold, the amount of substrate movement increases.

The examples set forth herein include providing a controlled rapid pump down of a processing chamber including maintaining a pressure differential between a frontside and a backside of a substrate during and after processing. The pressure differential is such that the frontside pressure is greater than the backside pressure. The controlled rapid pump down prevents substrate movement during and after processing. This is unlike an uncontrolled rapid pump down, which risks movement of the substrate. By maintaining this pressure differential during and subsequent to processing, a corresponding processing chamber is able to be quickly depressurized, which decreases time associated with processing and allows for increased throughput. In an embodiment, the rate of depressurization is increased to a maximum rate at which if exceeded the frontside pressure would drop below the backside pressure and cause a wafer "slide" event. Depressurization of the processing chamber is able to occur prior to lifting the substrate off the top surface of the body of the substrate support, which allows the processing chamber to be depressurized within a shorter period of time.

FIG. 1 shows an example substrate processing system 100 including a pressure control system 102. The pressure control system 102 controls a pressure differential between a frontside pressure (designated P1) and a backside pressure (designated P2) of a substrate 104. The pressure control system 102 may control the pressure differential prior to, during, and subsequent to processing of the substrate 104.

The substrate processing system 100 further includes a processing chamber 106 that encloses some components of the substrate processing system 100 and contains RF plasma (if used). The substrate processing system 100 includes a gas distribution plate (GDP) 108 (sometimes referred to as a showerhead) and a substrate support 110. The substrate 104 is arranged on the substrate support 110. The GDP 108 introduces and distributes process gases during processing of the substrate 104.

If plasma is used, the plasma can be direct or remote plasma. In this example, an RF generating system 120 generates and outputs an RF voltage to either the GDP 108 or the substrate support 110 (the other may be DC grounded, AC grounded, or floating). For example only, the RF generating system 120 may include an RF voltage generator 122 that generates the RF voltage that is fed by a matching network 124 to the GDP 108 or the substrate support 110. Alternately, the plasma may be delivered by a remote plasma source 126.

A gas delivery system 140 includes one or more gas sources 142-1, 142-2, . . . , and 142-N (collectively gas sources 142), where N is a positive integer. The gas sources 142 supply one or more etch gas mixtures, precursor gas mixtures, cleaning gas mixtures, ashing gas mixtures, etc. to the processing chamber 106. Vaporized precursor may also be used. The gas sources 142 are connected by valves 144-1, 144-2, . . . , and 144-N (collectively valves 144) and mass flow controllers 146-1, 146-2, . . . , and 146-N (collectively mass flow controllers 146) to a manifold 148. An output of the manifold 148 is fed to the processing chamber 106. For example only, the output of the manifold 148 is fed to the GDP 108. In one embodiment, there is no flow of gas to the backside of the substrate 104. For example, there is no flow of helium to the backside of the substrate 104.

The substrate support 110 may be an electrostatic chuck including one or more electrodes 150 for electrostatically clamping the substrate 104 to a top surface 152 of a body 154 of the substrate support 110. Although shown as an electrostatic chuck, the substrate support 110 may be implemented as a pedestal void of mechanical and/or electrical components for holding the substrate 104 in place on the body 154 of the substrate support 110. The body 154 may include one or more plates. The substrate support 110 may include one or more heating elements 160 for heating the body 154. As an example, the heating elements 160 may include one or more heating coils.

A controller 170 controls operation of the substrate processing system 100 including the pressure control system 102. The controller 170 may control the pressure differential based on feedback signals from frontside (or chamber) pressure sensor 180 and backside pressure sensor 182. The sensors 180, 182 may be implemented as manometers. The frontside pressure sensor 180 measures pressure within the processing chamber 106. The backside pressure sensor 182 may measure pressure within a backside line 184 through which gas is drawn under vacuum from a backside (or bottom side) 186 of the substrate 104. The pressure measurements are provided as feedback information that is used to control depressurization including the removal of gas and the rate of removal of the gas from the processing chamber 106. The backside line 184 may extend through the body 154 of the substrate support to an area between the substrate 104 and the body 154.

The backside line 184, as shown, extends from the body 154 to an evacuation line 188 and may include a backside valve 190. In an embodiment, the backside valve 190 is implemented as a two state valve having an ON (or fully open) state and an OFF (or fully closed) state. The backside line 184 extends from a channel 191 in the body 154 to a point downstream from an evacuation valve 192. The channel 191 may extend vertically through one or more plates of the body 154 and to the top surface 152.

The evacuation valve 192 is located within the evacuation line 188 and is used to control flow of gas out of the processing chamber 106. The evacuation valve 192 may be adjusted between fully open, partially open, and closed states. As an example, the evacuation valve 192 may include a throttle plate 194 with variable (or infinite) position adjustability for regulating the opening of the evacuation valve 192 and thus regulating flow of gas from the processing chamber 106. As another example, the evacuation valve 192 may be a butterfly valve and/or other suitable type of valve. In an embodiment, each position of a plate (or disc) of the valve has a corresponding opening state. As referred to herein, the position of the evacuation valve 192 may refer to a position of the plate (or disc) and/or other component of the evacuation valve 192 that is used to adjust the opening of the evacuation valve 192. Although the evacuation line 188 is shown as extending from a bottom of the processing chamber 106, the evacuation line 188 may be located elsewhere. As another example, the evacuation line 188 may extend from a side of the processing chamber 106. The evacuation line 188 is used to draw gas from the processing chamber 106. A pump 196 is connected to the evacuation line 188 and draws gas from the processing chamber 106 and from the backside line 184. Gas can leak around edges of the substrate 104 between the substrate 104 and the body 154 and be drawn away from the backside 186 via the pump 196.

The controller 170 controls operation of the valves 190, 192 and the pump 196. In one embodiment, the pump 196 is continuously on during and subsequent to processing of the substrate 104 and continuously draws gas from the backside line 184 to maintain a low backside pressure. In one embodiment, the backside of the substrate 104 is pumped out constantly to maintain a minimum pressure on the backside of the substrate 104. The minimum pressure may decrease during the removal of gas and depressurization of the processing chamber.

The backside valve 190 may be in an ON state during and subsequent to processing of the substrate 104. The controller 170 may regulate and/or adjust position of the throttle plate 194 and/or opening state of the evacuation valve 192 to control the pressure differential between P1 and P2, such that P1 remains greater than P2. In one embodiment, the frontside pressure P1 is greater than or equal to a sum of the backside pressure P2 and a predetermined safety margin. The predetermined safety margin may be, for example, 5-30% of the frontside pressure P1. In one embodiment, the safety margin is at least 5% of the frontside pressure P1. In another embodiment, the safety margin is 5-15% of the frontside pressure P1. The safety margin is set to not be too large such that the substrate 104 is unable to be lifted off the top surface 152 of the body 154 via lift pins.

The controller 170 may control temperature of the substrate support by controlling an amount of current supplied to the heating elements 160. This control may be based on temperature signals from one or more temperature sensors (e.g., a temperature sensor 198 is shown). The controller 170 may also control other components of the substrate processing system 100. For example only, the controller 170 may: control the gas delivery system 140 to control flow of process gases; monitor process parameters such as temperature, pressure, power, etc.; and strike and extinguish plasma, remove reactants, etc. The controller 170 may further control a motor 199 for moving the GDP 108 and other upper chamber components relative to the substrate support 110 to adjust a size of a gap G between the GDP 108 and the substrate support 110. The controller 170 moves the GDP 108 away from the substrate support 110 for placement of the substrate 104 on the substrate support 110 and removal of the substrate 104 from the processing chamber 106.

FIGS. 2A-2B show an example substrate support assembly 200 and example lift pins 202 that may be used in the substrate processing system 100 of FIG. 1. Other lift pin assemblies may be included in the implementation of FIG. 1. The substrate support assembly 200 is provided as an example illustration including lift pins for: placing a substrate on a top surface of a body of a substrate support; and lifting the substrate off the body for removal from a corresponding processing chamber. The substrate support assembly 200 may be arranged in the processing chamber 106 of FIG. 1 and include a substrate supporting plate (also called a top plate) 210, a supporting column 212, and a base 214. The base 214 may include a ring shaped platform or structure (also called a lift ring) in which lift pins and lift pin holder assemblies are installed. The supporting column 212 may move relative to the base 214.

Lift pin holder assemblies 220 are arranged below the substrate supporting plate 210 on the base 214. Each of the lift pin holder assemblies 220 includes a base portion 226, one of the lift pins 202, and a lift pin holder 234. In some examples, the lift pin holder assemblies 220 and the lift pins 202 are generally cylindrically shaped. The lift pins 202 include circular grooves 231, which are useful in locking the lift pins 202 into the lift pin holder assemblies.

One or more guiding elements 240 may be used to guide the lift pins 202. In some examples, the guiding elements 240 include cylindrical supports 243 that are attached to a bottom surface of the substrate supporting plate 210. Each of the cylindrical supports 243 includes a bore 245 for receiving a middle portion the lift pin 202. Likewise, the substrate supporting plate 210 includes bores 241 for receiving an upper portion of the lift pins 202.

During use, the base 214 may be raised and lowered via a motor 246 relative to the substrate supporting plate 210 (e.g., using the controller 170 of FIG. 1 and suitable actuators) to vary a height of the upper end of the lift pins 202 relative to an upper surface of the substrate supporting plate 210. As a result, the lift pins 202 lift the substrate 222 above the substrate supporting plate 210 or are positioned to receive the substrate 222 to be loaded onto the substrate supporting plate 210. Clearance is provided between the substrate 222 and the upper surface of the substrate supporting plate 210 as shown at 248. The substrate supporting plate 210 may include a channel connected to a backside line, such as a channel similar to the channel 191 of FIG. 1, which is connected to the backside line 184.

FIGS. 3A-3B and 5A-6C show depressurization methods that may be implemented by the pressure control system 102 and controller 170 of FIG. 1 and include use of the substrate support assembly of FIG. 2A. At least some of the operations of the methods may be iteratively performed. The methods include implementation of algorithms for quickly removing gas from the processing chamber and thus quickly depressurizing the processing chamber 106 during substrate processing and/or subsequent to substrate processing. The frontside pressure is reduced quickly without the frontside pressure dropping below the backside pressure.

Figure 3A:
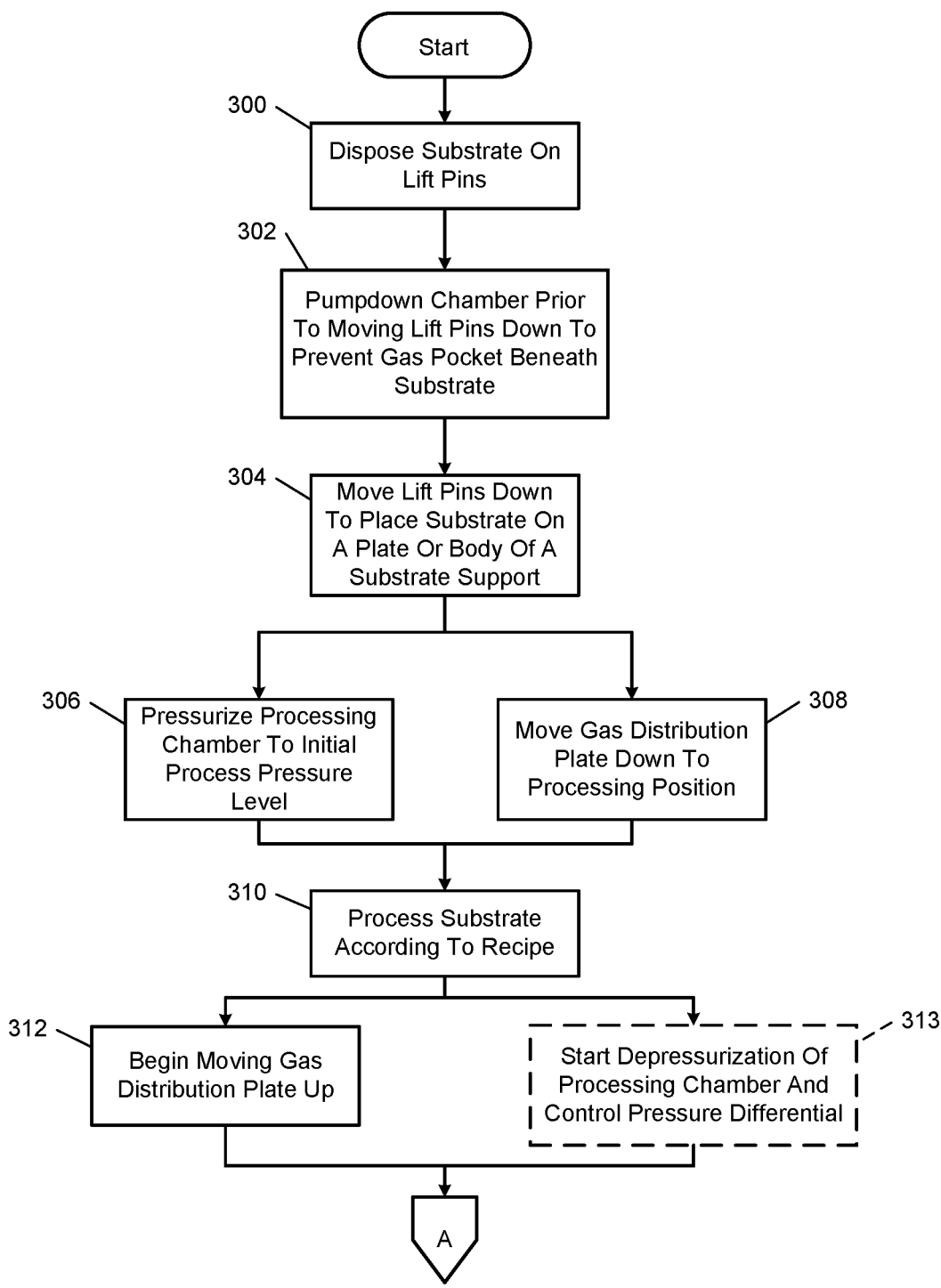
FIGS. 3A-3B illustrates a method for reducing pressure in a processing chamber including removing gas from the processing chamber in accordance with the present disclosure.
Figure 3B:
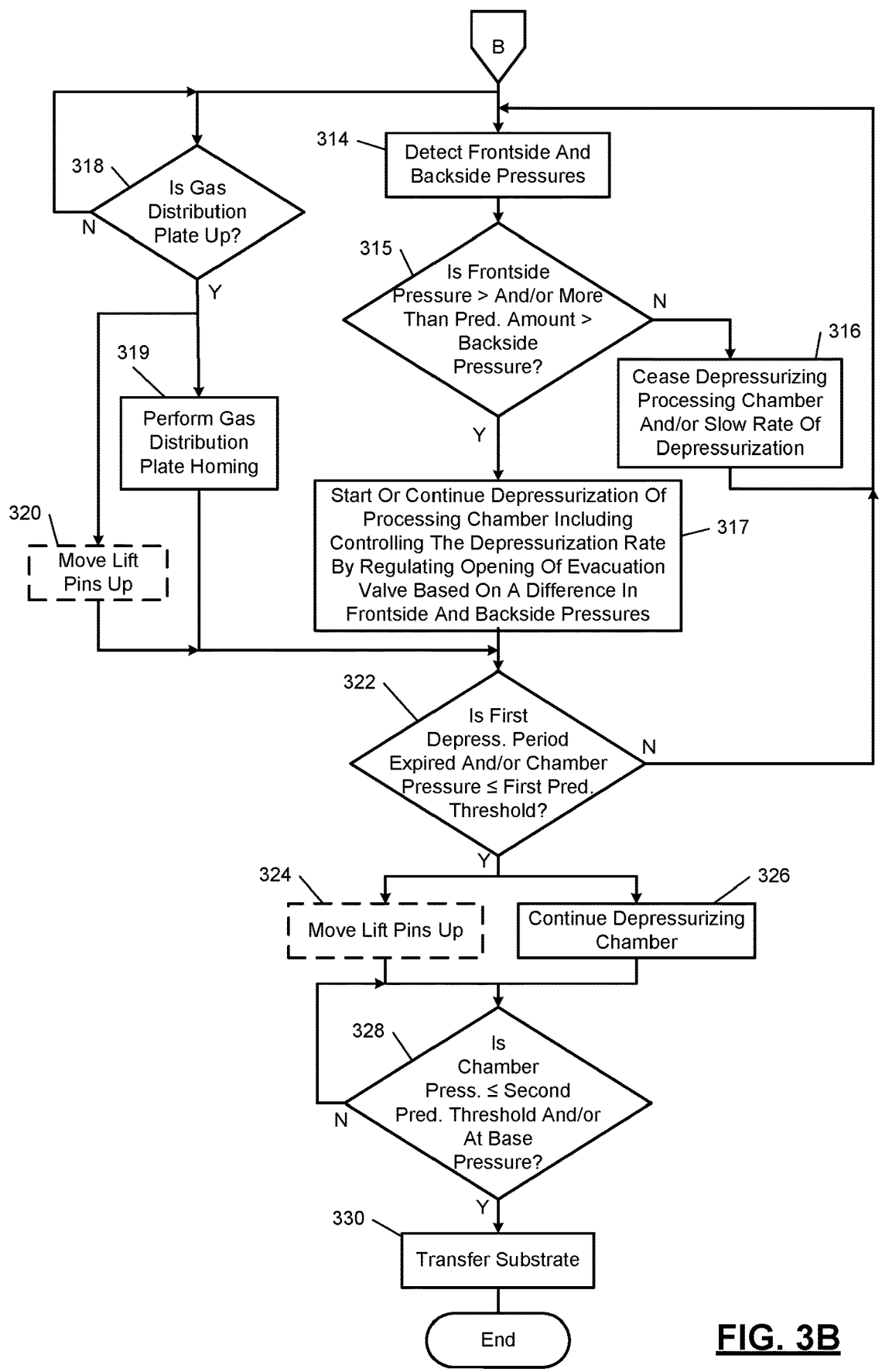

FIGS. 3A-3B shows a depressurization method, which may begin at 300. At 300, the substrate 104 is disposed on the lift pins 202. At 302, the corresponding processing chamber is pumped down. This may include opening the evacuation valve 192 and operating the pump 196 to evacuate and reduce pressure in the processing chamber 106 and prevent a gas pocket beneath the substrate 104. At 304, the controller 170 moves the lift pins 202 down to place the substrate on, for example, the plate 210 or the body 154 of the corresponding substrate support 110. If the substrate support 110 is an electrostatic chuck, then the controller 170 may electrostatically clamp the substrate 104 to the substrate support 110.

At 306, the controller 170 pressurizes the processing chamber to initial process pressure level according to a process recipe. The initial pressure level may be less than or equal to a low pressure. For example, the initial process pressure may be less than or equal to 4-5 Torr. At 308, the controller 170 moves the GDP 108 down from, for example, a home position to a processing position. The processing position corresponds to a predetermined gap between the GDP 108 and the substrate support. Operation 308 may be performed while operation 306 is performed.

At 310, the substrate 104 is processed according to the process recipe. During processing, the controller 170 may regulate the opening of the evacuation valve 192, which may include regulating the position of the evacuation valve 192, to maintain the frontside pressure at the process pressure level. This may include various processing operations, such as etch, deposition and/or cleaning operations. During processing, the pressure within the processing chamber 106 is less than or equal to the low pressure (e.g., less than or equal to 4-5 Torr). The substrate processing may include formation of features within and/or on the substrate 104.

At 312, subsequent to the processing of the substrate 104, the controller 170 begins moving the GDP 108 up away from the substrate support. At 313, the controller may start removing gas from the processing chamber 106 to depressurize the processing chamber 106 and control the pressure differential by controlling the opening of the evacuation valve 192. The controller 170 may open the evacuation valve 192 to begin pump down of the processing chamber 106 to the base pressure or predetermined setpoint pressure. Operation 313 may be performed while operation 312 is performed.

At 314, the sensors 180, 182 generate pressure signals, which are received at the controller 170. At 315, the controller 170 determines whether a differential pressure condition is satisfied, which may include determining whether the frontside pressure is (i) greater than the backside pressure, and/or (ii) more than a predetermined amount greater than the backside pressure. The predetermined amount may be equal to the predetermined safety margin described above. In one embodiment, the safety margin is maintained. As an example, the backside pressure may be subtracted from the frontside pressure and compared to the predetermined safety margin. If the difference is greater than or equal to the safety margin, then the differential pressure condition is satisfied, otherwise the differential pressure condition is not satisfied. In another embodiment, no safety margin is maintained and the controller 170 simply checks if the frontside pressure is greater than the backside pressure. If the frontside pressure is greater, than the differential pressure condition is satisfied. If the differential pressure condition is not satisfied, operation 316 may be performed, otherwise operation 317 is performed.

At 316, the controller 170 may cease depressurizing the processing chamber 106 or slow the rate of depressurization by transitioning the valve 192 to a more closed state (or position). This may include closing the evacuation valve 192. In one embodiment, the valve 192 is incrementally closed until the frontside pressure is greater than the backside pressure and/or greater than a sum of the backside pressure and the safety margin. Operation 314 may be performed subsequent to operation 316.

At 317, the controller 170 starts or continues to depressurize the processing chamber. This may include controlling the frontside pressure and the depressurization rate by regulating the opening of the evacuation valve 192 based on a difference in the frontside pressure and the backside pressure. The opening regulation prevents sharp drops in the frontside pressure. The controller 170 may monitor the rate of change in the difference between the frontside and backside pressures. If the difference is decreasing too fast, then the controller 170 may reduce a size of the opening through the evacuation valve 192 by partially closing the evacuation valve 192 to slow the rate of evacuation from the processing chamber 106. If the rate of change in the differential pressure exceeds a predetermined threshold, then the evacuation valve 192 may be transitioned to a more closed state. If the difference is decreasing at less than a predetermined rate, is not changing, and/or is increasing, then the controller 170 may further open the evacuation valve 192 to increase flow of gas from the processing chamber 106. If the rate of change in the differential pressure is does not exceed the predetermined threshold, then the evacuation valve 192 may be transitioned to a more open state. The controller 170, during operations 313, 314, 315 and 317, may maximize an opening of the evacuation valve 192 to maximize a depressurization rate of the processing chamber while preventing the frontside pressure from dropping below the backside pressure. This may also occur while maintaining the differential pressure safety margin. The controller 170 may continue to increase the opening of the evacuation valve 192 until one of the above-stated conditions is satisfied which prevents further opening the evacuation valve 192.

Operations 314-317 may be performed in parallel with operations 318-320.

At 318, the controller 170 may determine whether the GDP 108 is up. If yes, operation 319 and 320 may be performed. At 319, the controller 170 performs gas distribution plate homing. The motor 199 used to move the GDP 108 may be a stepper motor and the controller 170 may home to zero the position of the stepper motor. At 320, the controller 170 may move the lift pins 202 up. This includes overcoming downward pressure remaining on the substrate 104. Once the substrate 104 is not in contact with a plate or body of the substrate support, the frontside and backside pressures equalize. If the substrate support 110 is an electrostatic chuck, the controller 170 ceases clamping the substrate 104 to the substrate support 110 prior to lifting the substrate 104. In one embodiment, operation 320 is performed when the frontside pressure is less than a first predetermined threshold (e.g., 2 Torr). In one embodiment, operation 320 is not performed until after operation 322, as shown by operation 324. Operation 322 may be performed subsequent to operations 317, 319 and 320.

At 322, the controller 170 may determine whether a first depressurization period has expired since starting depressurization at 320 and/or whether the frontside pressure is less than or equal to a first predetermined threshold. The first predetermined threshold may be 2000 milli-Torr (mT). In one embodiment, the controller 170 determines whether the frontside pressure is between 500-2000 mT prior to permitting upward movement of the lift pins 202. If yes, operations 324 and 326 may be performed, otherwise operation 314 may be performed.

At 324, the controller 170 may move the lift pins 202 up, as described above. At 326, the controller 170 continues to depressurize the processing chamber. Once the substrate is lifted off the top surface 152 of the body 154 of the substrate support 110, (i) the evacuation valve 192 may be fully opened, if not already fully open, to maximize the depressurization rate, and (ii) a pressure differential between the frontside and backside of the substrate 104 is no longer maintained. If the substrate support 110 is an electrostatic chuck, the controller 170 ceases clamping the substrate 104 to the substrate support 110 prior to lifting the substrate 104. Operation 326 may be performed while operation 324 is performed.

At 328, the controller 170 may determine whether the processing chamber pressure is less than or equal to a second predetermined threshold and/or at the base pressure. If yes, operation 330 may be performed to remove the substrate 104 from the processing chamber 106.

Figure 4:
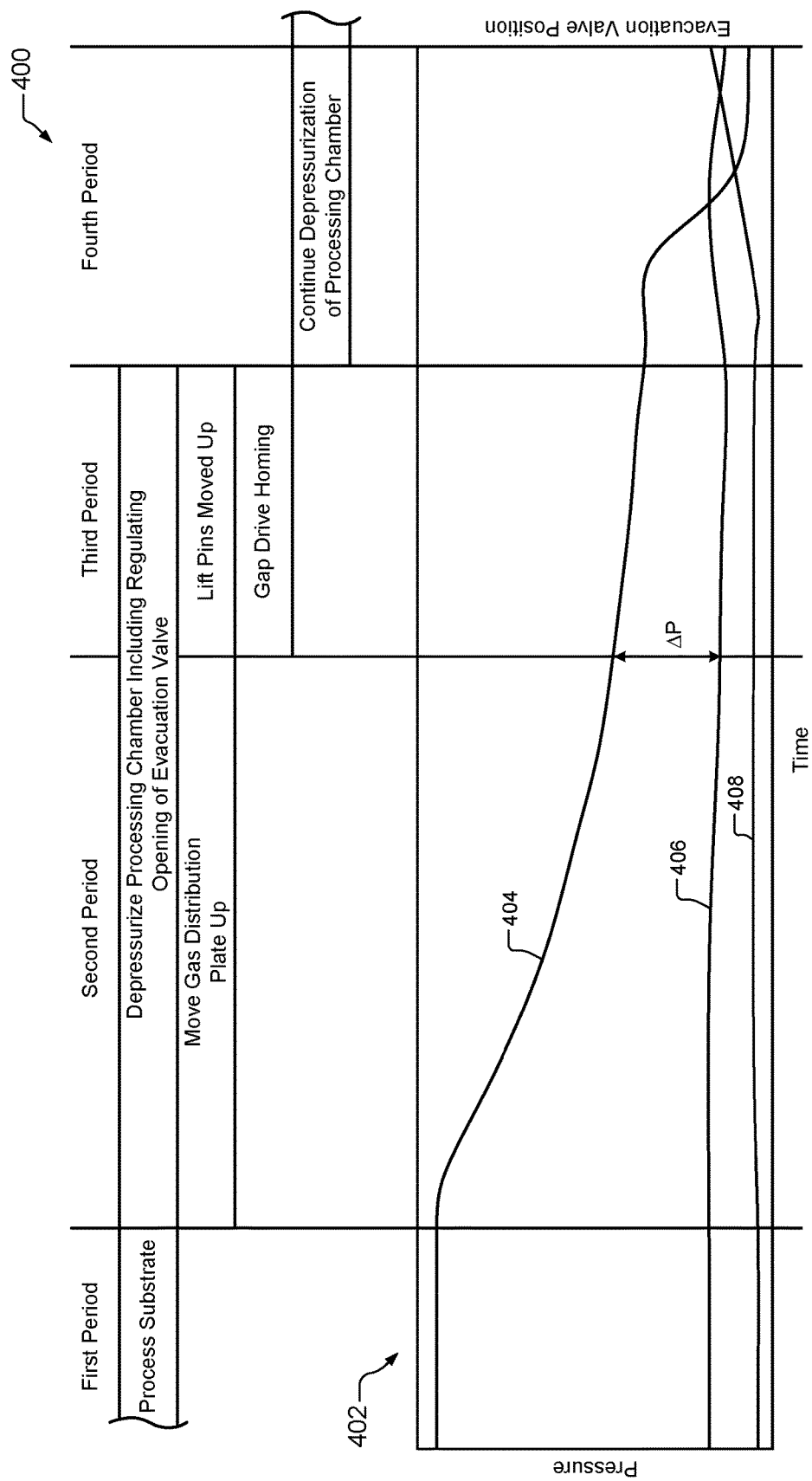
FIG. 4 is a timing diagram and plot illustrating portions of the method of FIGS. 3A-3B.

FIG. 4 shows an example timing diagram 400 and plot 402 illustrating portions of the depressurization method of FIGS. 3A-3B. The timing diagram 400 illustrates four periods. The first period is shown, which corresponds to operation 310. The second period is shown corresponding to operations 312, 313, 317. The third period is shown and corresponds to operations 317, 319, 320. Although the lift pins are shown as being moved up during the third period, the lift pins may be moved up during the fourth period as represented by operation 324. The fourth period is shown and corresponds to at least operation 326. As an example, the second period may be 3 seconds in length, the third period may be 2 seconds in length, and the fourth period may be 2 seconds in length.

The plot 402 includes a frontside pressure curve 404, a backside pressure curve 406 and an evacuation valve opening curve 408. As shown, the frontside pressure decreases during removal of gas from and as a result depressurization of the processing chamber 106 of FIG. 1. During depressurization of the processing chamber 106, the backside pressure also decreases, but at a significantly slower rate than the frontside pressure. A differential pressure ΔP is shown. The differential pressure prevents undershoot of the frontside pressure relative to the backside pressure. The controller 170 of FIG. 1 controls the position and thus the opening of the evacuation valve 192 to prevent the frontside pressure from decreasing below the backside pressure during at least the second and third periods. The frontside pressure may decrease below the backside pressure during the fourth period, as shown.

Figure 5A:
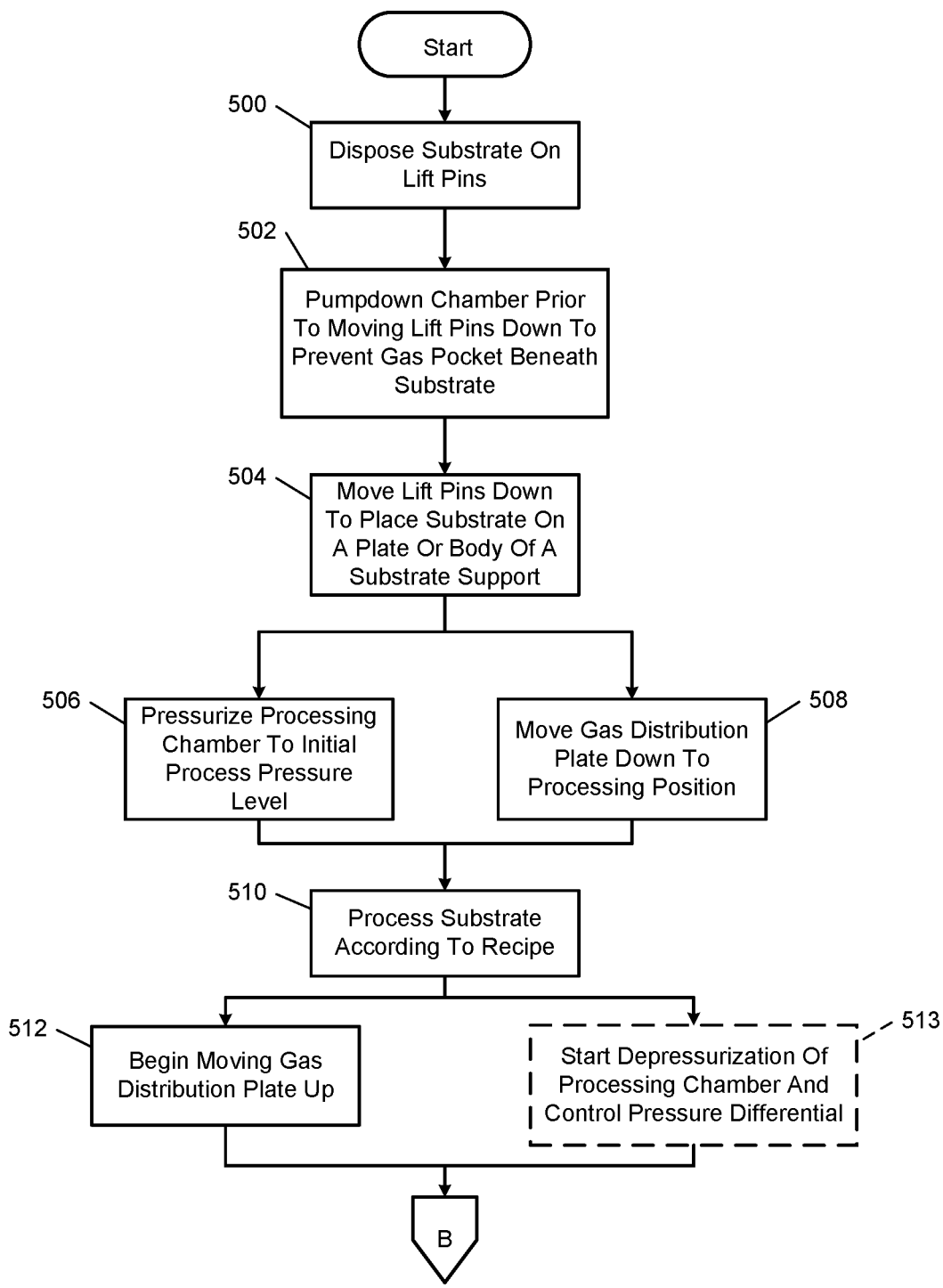
FIGS. 5A-5B illustrates a method for reducing pressure within a processing chamber including removing gas to transition from a high-pressure traditionally associated with substrate movement in accordance with the present disclosure.
Figure 5B:
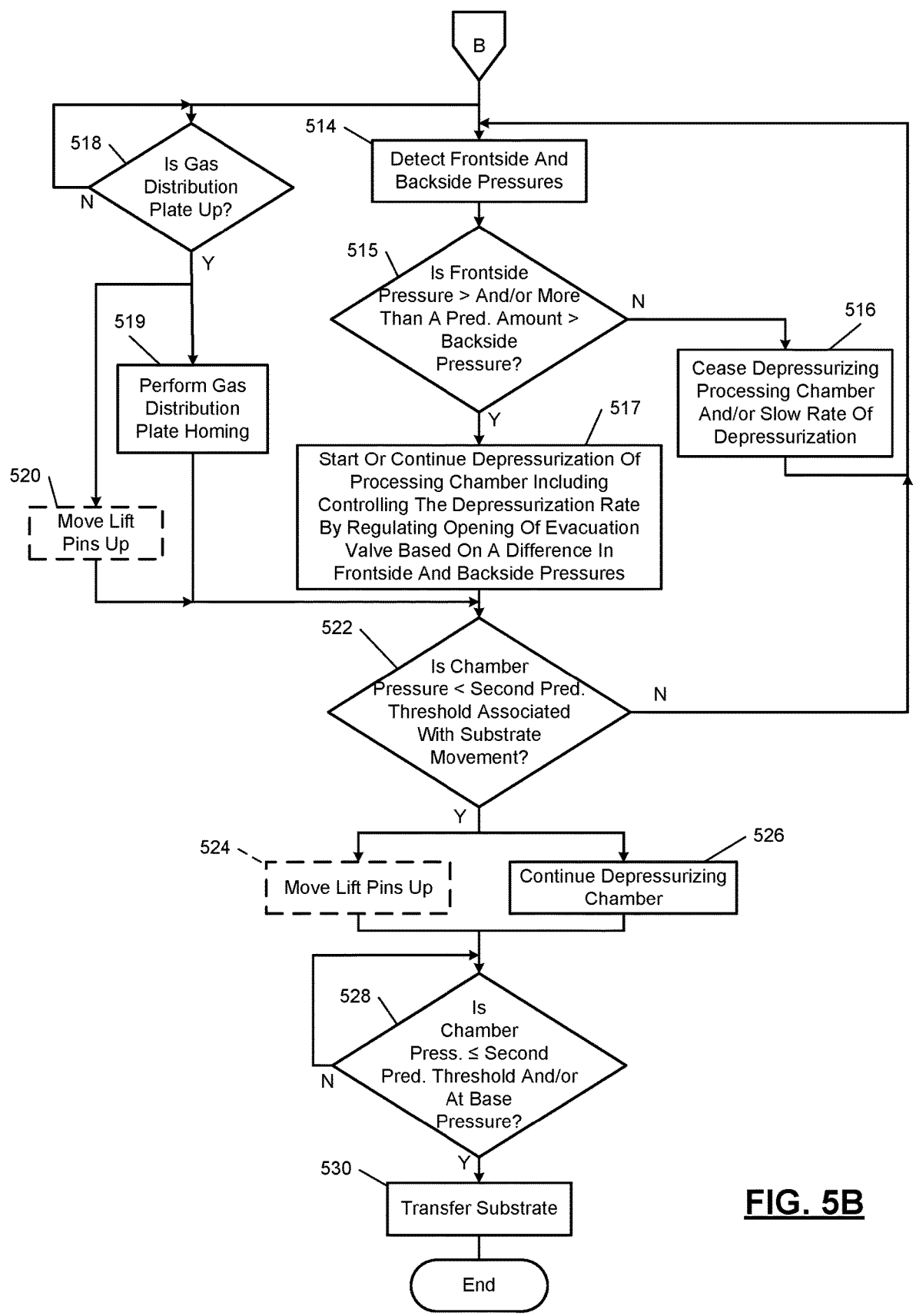

FIGS. 5A-5B shows a depressurization method for transitioning from a high-pressure traditionally associated with substrate movement. As an example, the high-pressure may be greater than 4-5 Torr. In an embodiment, the high-pressure is greater than 4 Torr. In another embodiment, the high-pressure is greater than 5 Torr. As another example, the high-pressure may be 4-8 Torr. The method may begin at 500, which includes the substrate 104 being disposed on the lift pins 202. At 502, the corresponding processing chamber is pumped down. This may include opening the evacuation valve 192 and operating the pump 196 to evacuate and reduce pressure in the processing chamber 106 and prevent a gas pocket beneath the substrate 104. At 504, the controller 170 moves the lift pins 202 down to place the substrate 104 on, for example, the plate 210 or the body 154 of the corresponding substrate support 110. If the substrate support 110 is an electrostatic chuck, then the controller 170 may electrostatically clamp the substrate 104 to the substrate support 110.

At 506, the controller 170 pressurizes the processing chamber to initial process pressure level according to a process recipe. The initial processing pressure or a subsequent pressure may be 4-8 Torr. At 508, the controller 170 moves the GDP 108 down from, for example, a home position to a processing position. The processing position corresponds to a predetermined gap between the GDP 108 and the substrate support 110. Operation 508 may be performed while operation 506 is performed.

At 510, the substrate 104 is processed according to the process recipe. During processing, the controller 170 may regulate the opening of the evacuation valve 192 to maintain the frontside pressure at the process pressure level. This may include various processing operations, such as etch, deposition and/or cleaning operations. This may include forming features within and/or on the substrate 104.

At 512, subsequent to the processing of the substrate 104, the controller 170 begins moving the GDP 108 up away from the substrate support. At 513, the controller 170 may start removal of gas from and depressurization of the processing chamber 106 and control the pressure differential by controlling the opening of the evacuation valve 192. Operation 513 may be performed while operation 512 is performed.

At 514, the sensors 180, 182 generate pressure signals, which are received at the controller 170. At 515, the controller 170 determines whether a differential pressure condition is satisfied, which may include determining whether the frontside pressure is (i) greater than the backside pressure, and/or (ii) more than a predetermined amount greater than the backside pressure. The predetermined amount may be equal to the predetermined safety margin described above. In one embodiment, the safety margin is maintained. As an example, the backside pressure may be subtracted from the frontside pressure and compared to the predetermined safety margin. If the difference is greater than or equal to the safety margin, then the differential pressure condition is satisfied, otherwise the differential pressure condition is not satisfied. In another embodiment, no safety margin is maintained and the controller 170 simply checks if the frontside pressure is greater than the backside pressure. If the frontside pressure is greater, than the differential pressure condition is satisfied. If the differential pressure condition is not satisfied, operation 516 may be performed, otherwise operation 517 is performed.

At 516, the controller 170 may cease depressurizing the processing chamber 106 or slow the rate of depressurization by transitioning the valve 192 to a more closed state. This may include closing the evacuation valve 192. In one embodiment, the valve 192 is incrementally closed until the frontside pressure is greater than the backside pressure and/or greater than a sum of the backside pressure and the safety margin. Operation 514 may be performed subsequent to operation 516.

At 517, the controller 170 may perform operations similar to that performed at 317 and starts or continues to depressurize the processing chamber 106. This may include controlling the frontside pressure and the depressurization rate by regulating the opening of the evacuation valve 192 based on a difference in the frontside pressure and the backside pressure. The controller 170 may monitor the rate of change in the difference between the frontside and backside pressures. If the difference is decreasing too fast, then the controller 170 may reduce a size of the opening through the evacuation valve 192 by partially closing the evacuation valve 192 to slow the rate of evacuation from the processing chamber 106. If the difference is decreasing at less than a predetermined rate, is not changing, or is increasing, then the controller 170 may further open the evacuation valve 192 to increase flow of gas from the processing chamber 106.

Operations 514-517 may be performed in parallel with operations 518-520.

At 518, the controller 170 may determine whether the GDP 108 is up. If yes, operation 519 and 520 may be performed. At 519, the controller 170 performs gas distribution plate homing. At 520, the controller 170 may move the lift pins 202 up as described above with respect to operation 320. If the substrate support 110 is an electrostatic chuck, the controller 170 ceases clamping the substrate 104 to the substrate support 110 prior to lifting the substrate 104. In one embodiment, operation 520 is not performed until after operation 522, as shown by operation 524. Operation 522 may be performed subsequent to operations 517, 519 and 520.

At 522, the controller 170 may determine whether the pressure within the processing chamber is less than or equal to a second predetermined threshold. The second predetermined threshold may refer to a pressure that is less than or equal to, for example, 4-5 Torr. This operation may be performed to minimize popping and/or shifting of the substrate 104 subsequent to processing and during depressurization. Although not shown in FIG. 5B, the controller 170 may also determine whether a second depressurization period has expired since starting depressurization at 520. In one embodiment, if the frontside pressure is less than or equal to the second predetermined threshold, then operations 524 and 526 are performed, otherwise operation 514 is performed. In another embodiment, if the frontside pressure is less than or equal to the second predetermined threshold and the second depressurization period has expired, then operations 524 and 526 are performed, otherwise operation 514 is performed.

At 524, the controller 170 may move the lift pins 202 up, as described above. At 526, the controller 170 continues to depressurize the processing chamber. Once the substrate is lifted off the top surface 152 of the body 154 of the substrate support 110, (i) the evacuation valve 192 may be fully opened, if not already fully open, to maximize the depressurization rate, and (ii) a pressure differential between the frontside and backside of the substrate 104 is no longer maintained. If the substrate support 110 is an electrostatic chuck, the controller 170 ceases clamping the substrate 104 to the substrate support 110 prior to lifting the substrate 104. Operation 526 may be performed while operation 524 is performed.

At 528, the controller 170 may determine whether the processing chamber pressure is less than or equal to a second predetermined threshold and/or at the base pressure. If yes, operation 530 may be performed to remove the substrate 104 from the processing chamber 106.

Figure 6A:
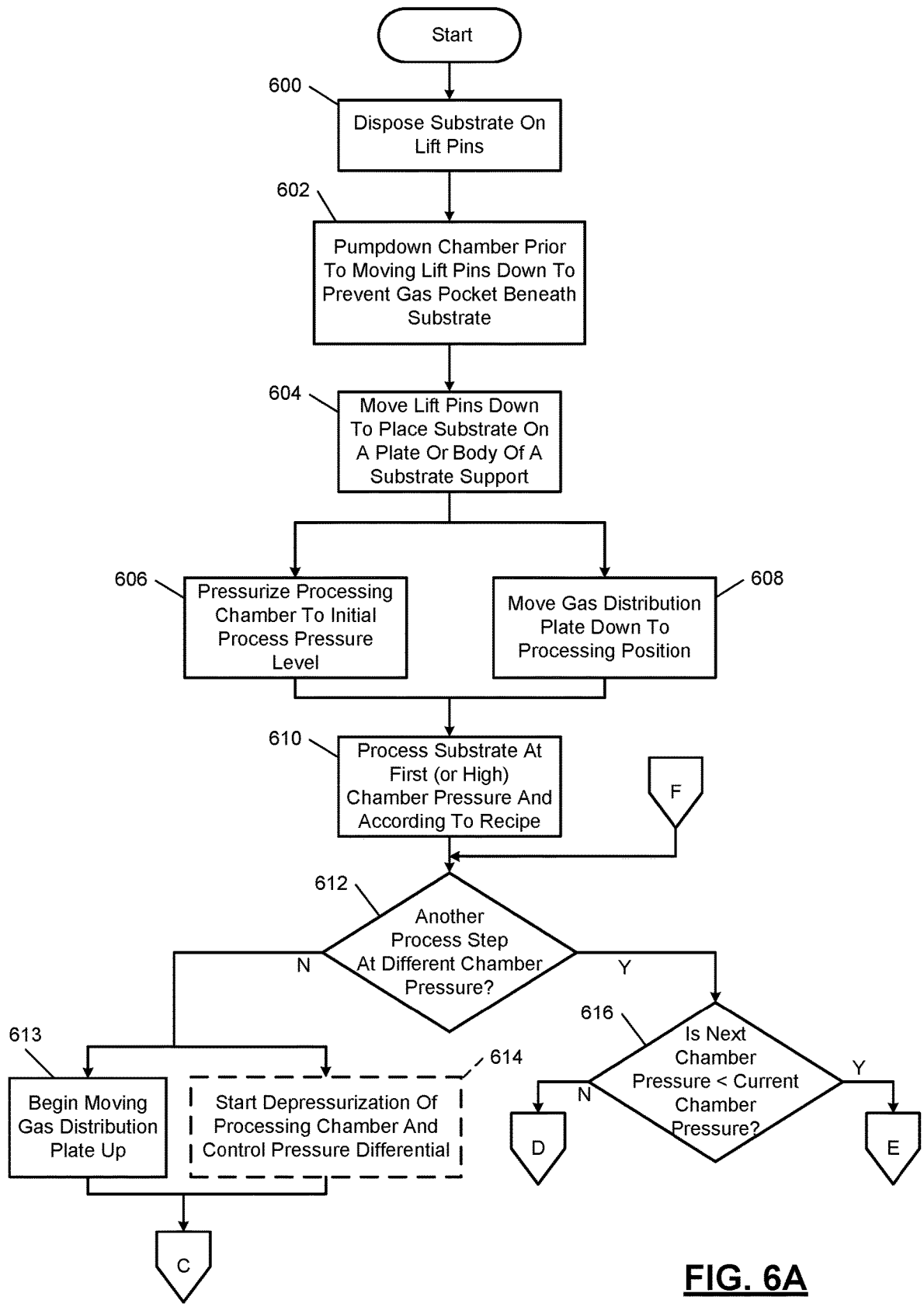
FIGS. 6A-6C illustrates a multiple pressure transitioning process including removal of gas to depressurize a processing chamber in accordance with the present disclosure.
Figure 6B:
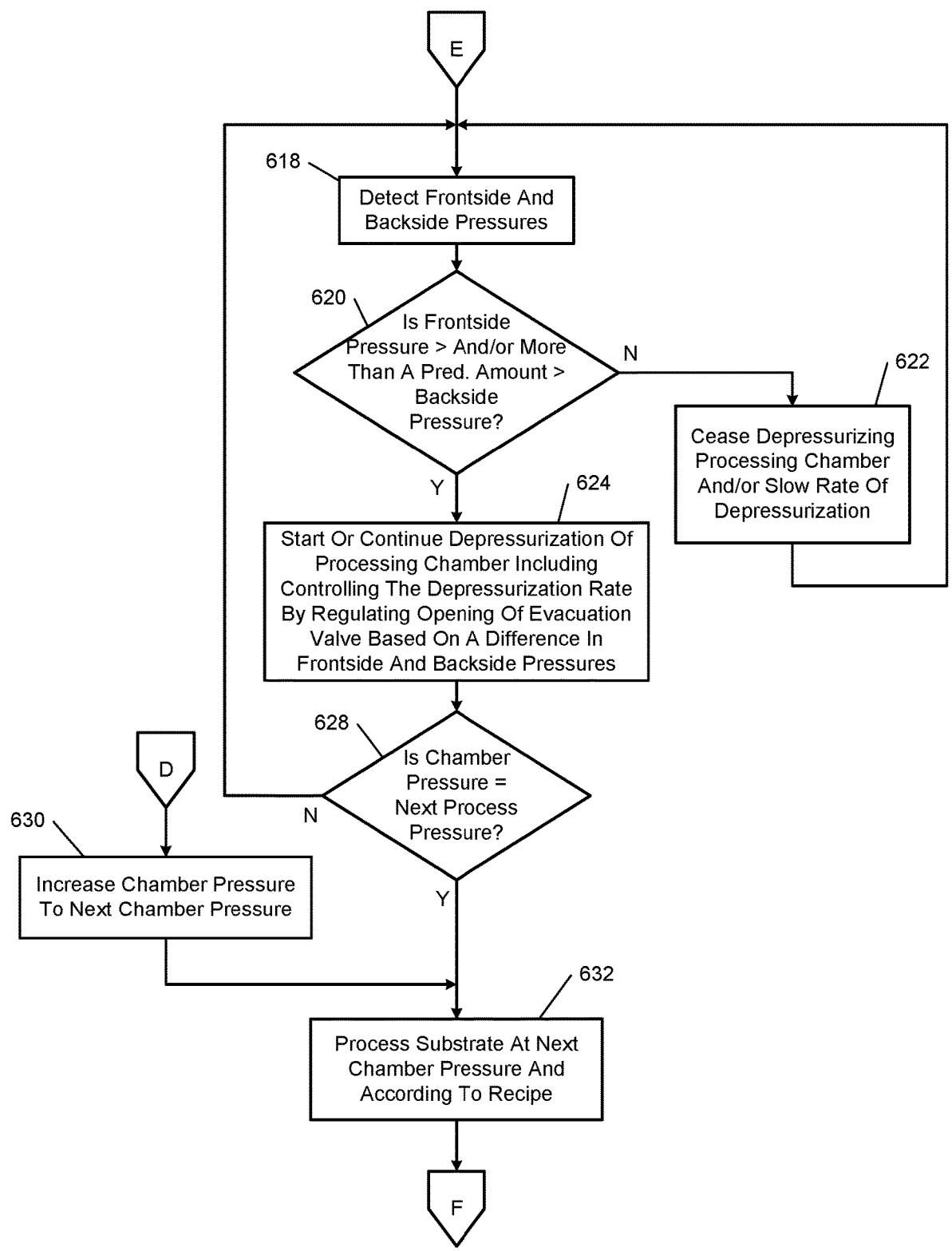
Figure 6C:
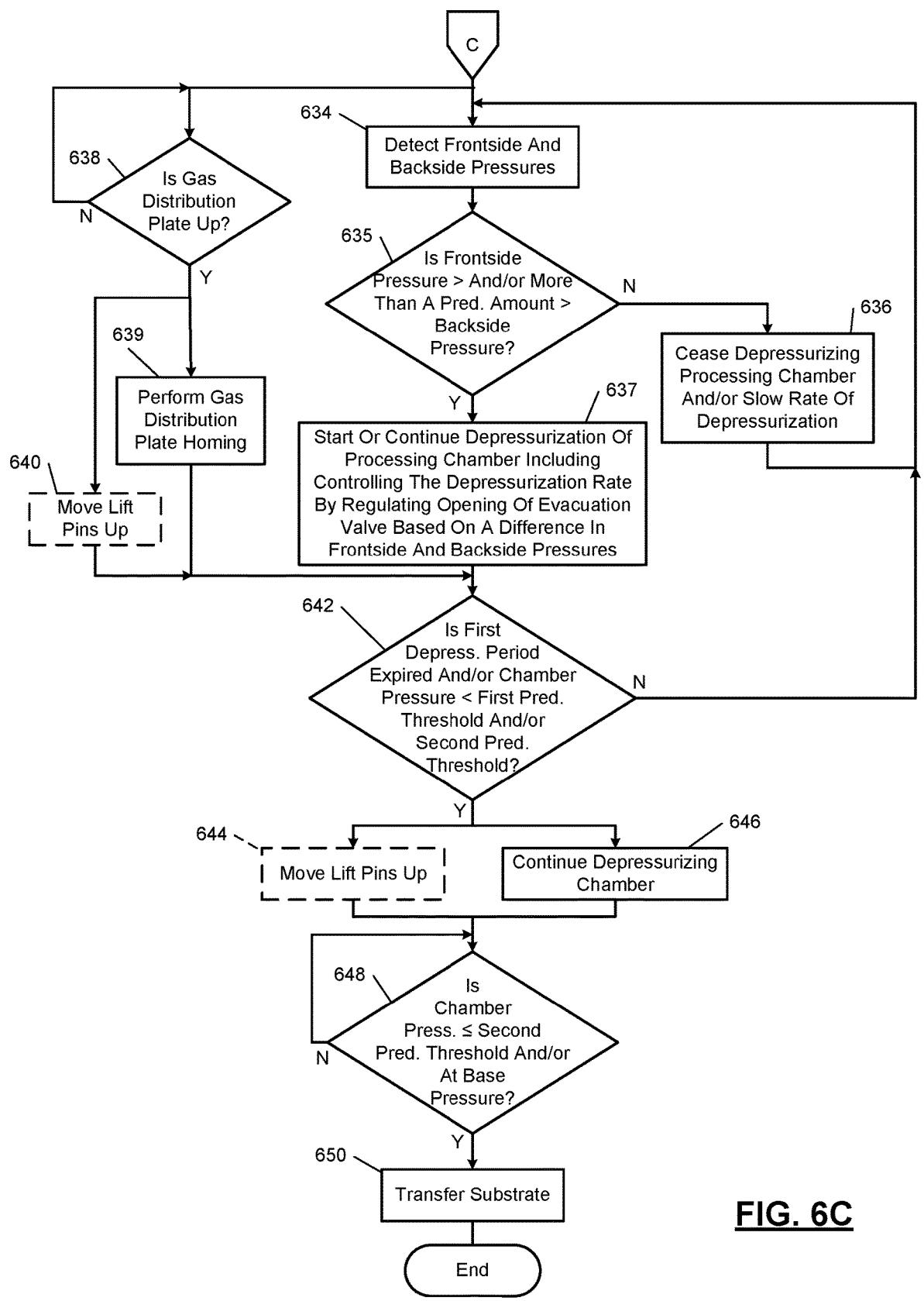

FIGS. 6A-6C shows a multiple pressure transitioning process including depressurization. The method may begin at 600, which includes the substrate 104 being disposed on the lift pins 202. At 602, the corresponding processing chamber is pumped down. This may include opening the evacuation valve 192 and operating the pump 196 to evacuate and reduce pressure in the processing chamber 106 and prevent a gas pocket beneath the substrate 104. At 604, the controller 170 moves the lift pins 202 down to place the substrate 104 on, for example, the plate 210 or the body 154 of the corresponding substrate support 110. If the substrate support 110 is an electrostatic chuck, then the controller 170 may electrostatically clamp the substrate 104 to the substrate support 110.

At 606, the controller 170 pressurizes the processing chamber to initial process pressure level according to a process recipe. The initial pressure level may be a high-pressure (e.g., 4-8 Torr), or a low pressure (e.g., less than or equal to 4-5 Torr). At 608, the controller 170 moves the GDP 108 down from, for example, a home position to a processing position. The processing position corresponds to a predetermined gap between the GDP 108 and the substrate support. Operation 608 may be performed while operation 606 is performed.

At 610, the substrate 104 is processed according to the process recipe. During processing, the controller 170 may regulate the opening of the evacuation valve 192 to maintain the frontside pressure at the first process pressure level. This may include various processing operations, such as etch, deposition and/or cleaning operations. This may include forming features within and/or on the substrate 104.

At 612, the controller 170 determines whether there is another process step at a different processing chamber pressure that is different than a current processing chamber pressure. If no, operations 612 and 613 may be performed, otherwise operation 616 may be performed.

At 613, the controller 170 begins moving the GDP 108 up away from the substrate support. At 614, the controller 170 may start removal of gas from and as a result depressurization of the processing chamber and control the pressure differential by controlling the opening of the evacuation valve 192. Operation 614 may be performed while operation 613 is performed. Operations 634 and 638 may be performed subsequent to operations 613 and 614.

At 616, the controller 170 may determine whether the next processing chamber pressure is less than the current processing chamber pressure. If no, operation 630 may be performed, otherwise operation 618 may be performed.

At 618, the sensors 180, 182 generate pressure signals, which are received at the controller 170. At 620, the controller 170 determines whether a differential pressure condition is satisfied, which may include determining whether the frontside pressure is (i) greater than the backside pressure, and/or (ii) more than a predetermined amount greater than the backside pressure. The predetermined amount may be equal to the predetermined safety margin described above. In one embodiment, the safety margin is maintained. As an example, the backside pressure may be subtracted from the frontside pressure and compared to the predetermined safety margin. If the difference is greater than or equal to the safety margin, then the differential pressure condition is satisfied, otherwise the differential pressure condition is not satisfied. In another embodiment, no safety margin is maintained and the controller 170 simply checks if the frontside pressure is greater than the backside pressure. If the frontside pressure is greater, than the differential pressure condition is satisfied. If the differential pressure condition is not satisfied, operation 622 may be performed, otherwise operation 624 is performed.

At 622, the controller 170 may cease depressurizing the processing chamber 106 or slow the rate of depressurization by transitioning the valve 192 to a more closed state. This may include closing the evacuation valve 192. In one embodiment, the valve 192 is incrementally closed until the frontside pressure is greater than the backside pressure and/or greater than a sum of the backside pressure and the safety margin. Operation 618 may be performed subsequent to operation 622.

At 624, the controller 170 may perform operations similar to that performed at 317 and starts or continues to depressurize the processing chamber 106. This may include controlling the frontside pressure and the depressurization rate by regulating opening of the evacuation valve 192 based on a difference in the frontside pressure and the backside pressure. The controller 170 may monitor the rate of change in the difference between the frontside and backside pressures. If the difference is decreasing too fast, then the controller 170 may reduce a size of the opening through the evacuation valve 192 by partially closing the evacuation valve 192 to slow the rate of evacuation from the processing chamber 106. If the difference is decreasing at less than a predetermined rate, is being maintained, or is increasing, then the controller 170 may further open the evacuation valve 192 to increase flow of gas from the processing chamber 106.

At 628, the controller 170 may determine whether the process chamber pressure is at the next process pressure. If yes, operation 632 may be performed, otherwise operation 618 may be performed.

At 630, the pressure within the processing chamber 106 is increased to the next processing pressure.

At 632, the substrate 104 is processed at the next processing chamber pressure and according to the process recipe. During processing, the controller 170 may regulate the opening of the evacuation valve 192 to maintain the frontside pressure at the next process pressure level. This may include various processing operations, such as etch, deposition and/or cleaning operations. This may include forming features within and/or on the substrate 104.

At 634, the sensors 180, 182 generate pressure signals, which are received at the controller 170. At 635, the controller 170 determines whether a differential pressure condition is satisfied, which may include determining whether the frontside pressure is (i) greater than the backside pressure, and/or (ii) more than a predetermined amount greater than the backside pressure. The predetermined amount may be equal to the predetermined safety margin described above. In one embodiment, the safety margin is maintained. As an example, the backside pressure may be subtracted from the frontside pressure and compared to the predetermined safety margin. If the difference is greater than or equal to the safety margin, then the differential pressure condition is satisfied, otherwise the differential pressure condition is not satisfied. In another embodiment, no safety margin is maintained and the controller 170 simply checks if the frontside pressure is greater than the backside pressure. If the frontside pressure is greater, than the differential pressure condition is satisfied. If the differential pressure condition is not satisfied, operation 636 may be performed, otherwise operation 637 is performed.

At 636, the controller 170 ceases depressurizing the processing chamber 638. This may include closing the evacuation valve 192. Operation 634 may be performed subsequent to operation 636.

At 637, the controller 170 may perform operations similar to that performed at 317 and starts or continues to depressurize the processing chamber 106. This may include controlling the frontside pressure and the depressurization rate by regulating the opening of the evacuation valve 192 based on a difference in the frontside pressure and the backside pressure. The controller 170 may monitor the rate of change in the difference between the frontside and backside pressures. If the difference is decreasing too fast, then the controller 170 may reduce a size of the opening through the evacuation valve 192 by partially closing the evacuation valve 192 to slow the rate of evacuation from the processing chamber 106. If the difference is decreasing at less than a predetermined rate, is not changing, or is increasing, then the controller 170 may further open the evacuation valve 192 to increase flow of gas from the processing chamber 106.

Operations 634-637 may be performed in parallel with operations 638-640.

At 638, the controller 170 may determine whether the GDP 108 is up. If yes, operation 639 and 640 may be performed. At 639, the controller 170 performs gas distribution plate homing. At 640, the controller 170 may move the lift pins 202 up as described above with respect to operation 640. In one embodiment, operation 640 is not performed until after operation 642, as shown by operation 644. If the substrate support 110 is an electrostatic chuck, the controller 170 ceases clamping the substrate 104 to the substrate support 110 prior to lifting the substrate 104. Operation 642 may be performed subsequent to operations 637, 639, and 640.

At 642, the controller 170 may determine whether a first depressurization period has expired since starting depressurization at 640 and/or whether the pressure within the processing chamber is less than or equal to the first predetermined threshold of operation 322 of FIG. 3B and/or the second predetermined threshold 522 of FIG. 5B. If yes, operations 644 and 646 may be performed, otherwise operation 634 may be performed.

At 644, the controller 170 may move the lift pins 202 up, as described above. At 646, the controller 170 continues to depressurize the processing chamber. Once the substrate is lifted off the top surface 152 of the body 154 of the substrate support 110, (i) the evacuation valve 192 may be fully opened, if not already fully open, to maximize the depressurization rate, and (ii) a pressure differential between the frontside and backside of the substrate 104 is no longer maintained. If the substrate support 110 is an electrostatic chuck, the controller 170 ceases clamping the substrate 104 to the substrate support 110 prior to lifting the substrate 104. Operation 646 may be performed while operation 644 is performed.

At 648, the controller 170 may determine whether the processing chamber pressure is less than or equal to a second predetermined threshold and/or at the base pressure. If yes, operation 650 may be performed to remove the substrate 104 from the processing chamber 106.

The above-described operations of the methods of FIGS. 3A-3B and FIGS. 4A-6C are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A pressure control system comprising:
   a first sensor configured to detect a frontside pressure within a processing chamber, wherein the frontside pressure is indicative of a downforce on a substrate disposed on a substrate support within the processing chamber;
   a second sensor configured to detect a backside pressure on a backside of the substrate;

an evacuation valve; and a controller configured to control the evacuation valve to remove gas from and reduce the frontside pressure of the processing chamber, and during the removal of gas from and reduction in the frontside pressure of the processing chamber and based on the frontside pressure and the backside pressure, regulate an opening of the evacuation valve such that the frontside pressure does not drop below the backside pressure.

2. The pressure control system of claim 1, wherein the controller is configured to:

during the removal of gas from and reduction in the frontside pressure of the processing chamber, compare the frontside pressure to the backside pressure to provide a pressure differential value;

transition the evacuation valve from a first open state to a second open state when at least one of a rate of change of the pressure differential value exceeds a first threshold or the pressure differential value is less than or equal to a second threshold, wherein the second open state is a more closed state than the first open state; and transition the evacuation valve from the first open state to a third open state, when at least one of the rate of change of the pressure differential value does not exceed the first threshold or the pressure differential value is greater than the second threshold, wherein the third open state is a more open state than the first open state.

3. The pressure control system of claim 1, wherein the controller is configured to close the evacuation valve when the frontside pressure is less than or equal to the backside pressure.

4. The pressure control system of claim 1, wherein the controller is configured to remove gas from and reduce the frontside pressure of the processing chamber and regulate the opening of the evacuation valve at least one of during or subsequent to processing the substrate.

5. The pressure control system of claim 1, further comprising a backside valve, wherein the controller is configured to open the backside valve to continuously draw gas from the backside of the substrate during processing and removal of gas from and reduction in the frontside pressure of the processing chamber.

6. The pressure control system of claim 1, wherein the controller is configured to regulate the evacuation valve to maintain at least a safety margin between the frontside pressure and the backside pressure.

7. The pressure control system of claim 1, wherein the controller is configured to, during the removal of gas from and reduction in the frontside pressure of the processing chamber, maximize an opening of the evacuation valve to maximize a depressurization rate of the processing chamber while at least one of preventing the frontside pressure from dropping below the backside pressure or maintaining at least a safety margin between the frontside pressure and the backside pressure.

8. The pressure control system of claim 1, wherein the controller is configured to:

during the removal of gas from and reduction in the frontside pressure of the processing chamber, determine whether the frontside pressure is less than a predetermined pressure; and when the frontside pressure is less than the predetermined pressure, actuate lift pins to lift the substrate off a top surface of a body of the substrate support.

9. The pressure control system of claim 8, wherein the predetermined pressure is 4-5 Torr.

10. The pressure control system of claim 1, wherein the controller is configured to:

pressurize the processing chamber to provide a first frontside pressure;

process the substrate according to a first portion of a recipe;

remove gas from the processing chamber to provide a second frontside pressure that is less than the first frontside pressure; and process the substrate according to a second portion of the recipe.

11. The pressure control system of claim 10, wherein the first frontside pressure is greater than 4-5 Torr.

12. The pressure control system of claim 1, wherein:

the substrate support is void of mechanical and electrical components to hold the substrate in place on the substrate support; and the controller is configured to prevent the substrate from moving on the substrate support by pressuring the processing chamber.

13. The pressure control system of claim 1, wherein:

the substrate support is implemented as an electrostatic chuck; and the controller is configured to, during the removal of gas from and reduction in the frontside pressure of the processing chamber, cease electrostatic clamping of the substrate prior to lifting the substrate off a top surface of a body of the substrate support.

14. The pressure control system of claim 1, wherein the controller is configured to remove gas from the processing chamber to at least partially depressurize the processing chamber prior to actuating lift pins of the substrate support to lift the substrate off a top surface of a body of the substrate support.

15. The pressure control system of claim 1, wherein the controller is configured to remove gas from the processing chamber to reduce the frontside pressure in the processing chamber to less than a predetermined pressure prior to actuating lift pins of the substrate support to lift the substrate off a top surface of a body of the substrate support.

16. The pressure control system of claim 1, further comprising a pump, wherein the controller is configured to run the pump to draw gas from the processing chamber to reduce the frontside pressure of the processing chamber.

17. The pressure control system of claim 16, further comprising:

an evacuation line extending from the processing chamber to the pump;

a backside line extending from a channel in a body of the substrate support to the evacuation line; and a backside valve connected to the backside line and configured to control flow of gas through the backside line, wherein the evacuation valve is attached to the evacuation line upstream from the backside line.

18. The pressure control system of claim 17, wherein the second sensor detects pressure within the backside line.

19. A method of operating a pressure control system, the method comprising:

detecting a frontside pressure within a processing chamber, wherein the frontside pressure is indicative of a downforce on a substrate disposed on a substrate support within the processing chamber;

detecting a backside pressure on a backside of the substrate;

controlling an evacuation valve to remove gas from and reduce the frontside pressure of the processing chamber; and during the removal of gas from and reduction in the frontside pressure of the processing chamber and based on the frontside pressure and the backside pressure, regulate an opening of the evacuation valve such that the frontside pressure does not drop below the backside pressure.

20. The method of claim 19, further comprising:

during the removal of gas from and reduction in the frontside pressure of the processing chamber, comparing the frontside pressure to the backside pressure to provide a pressure differential value;

transitioning the evacuation valve from a first open state to a second open state when at least one of a rate of change of the pressure differential value exceeds a first threshold or the pressure differential value is less than or equal to a second threshold, wherein the second open state is a more closed state than the first open state; and transitioning the evacuation valve from the first open state to a third open state, when at least one of the rate of change of the pressure differential value does not exceed the first threshold or the pressure differential value is greater than the second threshold, wherein the third open state is a more open state than the first open state.

21. The method of claim 19, further comprising closing the evacuation valve when the frontside pressure is less than or equal to the backside pressure.

22. The method of claim 19, further comprising removing gas from and reducing the frontside pressure of the processing chamber and regulating the opening of the evacuation valve at least one of during or subsequent to processing the substrate.

23. The method of claim 19, further comprising opening a backside valve to continuously draw gas from the backside of the substrate during processing and removal of gas from and reduction in the frontside pressure of the processing chamber.

24. The method of claim 19, further comprising regulating the evacuation valve to maintain at least a safety margin between the frontside pressure and the backside pressure.

25. The method of claim 19, further comprising, during the removal of gas from and reduction in the frontside pressure of the processing chamber, maximizing an opening of the evacuation valve to maximize a depressurization rate of the processing chamber while at least one of preventing the frontside pressure from dropping below the backside pressure or maintaining at least a safety margin between the frontside pressure and the backside pressure.

26. The method of claim 19, further comprising:

during the removal of gas from and reduction in the frontside pressure of the processing chamber, determining whether the frontside pressure is less than a predetermined pressure; and when the frontside pressure is less than the predetermined pressure, actuating lift pins to lift the substrate off a top surface of a body of the substrate support.

27. The method of claim 26, wherein the predetermined pressure is 4-5 Torr.

28. The method of claim 19, further comprising:

pressurizing the processing chamber to provide a first frontside pressure;

processing the substrate according to a first portion of a recipe;

removing gas from the processing chamber to reduce the frontside pressure of the processing chamber and provide a second frontside pressure that is less than the first frontside pressure; and processing the substrate according to a second portion of the recipe.

29. The method of claim 28, wherein the first frontside pressure is greater than 4-5 Torr.

30. The method of claim 19, further comprising preventing the substrate from moving on the substrate support by pressuring the processing chamber, wherein the substrate support is void of mechanical and electrical components to hold the substrate in place on the substrate support.

31. The method of claim 19, further comprising, during the removal of gas from and reduction in the frontside pressure of the processing chamber, ceasing electrostatic clamping of the substrate prior to lifting the substrate off a top surface of a body of the substrate support.

32. The method of claim 19, further comprising removing gas from the processing chamber to at least partially depressurize the processing chamber prior to actuating lift pins of the substrate support to lift the substrate off a top surface of a body of the substrate support.

33. The method of claim 19, further comprising removing gas from the processing chamber to reduce the frontside pressure in the processing chamber to less than a predetermined pressure prior to actuating lift pins of the substrate support to lift the substrate off a top surface of a body of the substrate support.

34. The method of claim 19, further comprising running a pump to draw gas from the processing chamber to reduce the frontside pressure of the processing chamber.

* * * * *